(12) United States Patent
Takano et al.

(10) Patent No.: US 9,865,551 B2
(45) Date of Patent: Jan. 9, 2018

(54) METHODS TO CONTROL WAFER WARPAGE UPON COMPRESSION MOLDING THEREOF AND ARTICLES USEFUL THEREFOR

(71) Applicant: Henkel IP & Holding GmbH, Duesseldorf (DE)

(72) Inventors: Tadashi Takano, Irvine, CA (US); Gina Hoang, Garden Grove, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 14/953,787

(22) Filed: Nov. 30, 2015

(65) Prior Publication Data

US 2016/0079187 A1 Mar. 17, 2016

Related U.S. Application Data

(63) Continuation of application No. PCT/US2014/045710, filed on Jul. 8, 2014.

(60) Provisional application No. 61/857,094, filed on Jul. 22, 2013.

(51) Int. Cl.
*H01L 23/48* (2006.01)
*H01L 23/00* (2006.01)
*H01L 23/31* (2006.01)
*H01L 23/538* (2006.01)
(Continued)

(52) U.S. Cl.
CPC .......... *H01L 23/562* (2013.01); *H01L 21/565* (2013.01); *H01L 23/3114* (2013.01); *H01L 23/5384* (2013.01); *H01L 25/0652* (2013.01); *H01L 25/0655* (2013.01); *H01L 21/563* (2013.01); *H01L 2924/0002* (2013.01)

(58) Field of Classification Search
CPC . H01L 23/562; H01L 21/565; H01L 23/3114; H01L 23/5384; H01L 25/0652; H01L 25/0655; H01L 21/563; H01L 2924/0002
USPC .......................................................... 257/774
See application file for complete search history.

(56) References Cited

U.S. PATENT DOCUMENTS 4,477,629 A 10/1984 Hefner
4,528,366 A 7/1985 Woo et al.
(Continued)

FOREIGN PATENT DOCUMENTS

GB 1305702 2/1973
WO 8502184 5/1985
(Continued)

OTHER PUBLICATIONS

International Search Report issued in connection with International Patent Application No. PCT/US2014/045710 dated Oct. 23, 2014.

*Primary Examiner* — Vu A Vu
(74) *Attorney, Agent, or Firm* — Steven C. Bauman

(57) ABSTRACT

Provided herein are multilayer structures having a reduced propensity to warp upon curing of certain components thereof. In one aspect, there are provided multilayer assemblies comprising a plurality of the above-described multilayer structures. In another aspect, there are provided methods for reducing wafer warpage upon cure of molding compositions applied thereto. In yet another aspect, there are provided methods for preparing wafers having substantially no warpage upon cure thereof.

24 Claims, 1 Drawing Sheet

(51) Int. Cl.
*H01L 25/065* (2006.01)
*H01L 21/56* (2006.01)

(56) References Cited

U.S. PATENT DOCUMENTS

| | | | | |
|---|---|---|---|---|
| 5,656,862 | A * | 8/1997 | Papathomas | H01L 21/563 228/180.1 |
| 6,308,938 | B1 | 10/2001 | Futakuchi | |
| 6,887,574 | B2 | 5/2005 | Dean et al. | |
| 6,894,113 | B2 | 5/2005 | Court et al. | |
| 7,563,486 | B2 * | 7/2009 | Barth | G02B 6/12 427/372.2 |
| 7,670,649 | B2 | 3/2010 | Hoyles et al. | |
| 7,745,535 | B2 | 6/2010 | Schmidt et al. | |
| 7,820,760 | B2 | 10/2010 | Pham et al. | |
| 8,203,080 | B2 * | 6/2012 | Vasoya | H05K 3/4608 174/255 |
| 2008/0287595 | A1 | 11/2008 | Verghese et al. | |
| 2009/0236727 | A1 | 9/2009 | Murayama et al. | |
| 2009/0293630 | A1 * | 12/2009 | DiPaola | G01L 19/003 73/756 |
| 2010/0109169 | A1 | 5/2010 | Kolan et al. | |
| 2010/0181665 | A1 * | 7/2010 | Casey | H01L 23/04 257/723 |
| 2010/0327465 | A1 | 12/2010 | Shen et al. | |
| 2012/0018871 | A1 * | 1/2012 | Lee | H01L 25/0655 257/698 |
| 2012/0025362 | A1 * | 2/2012 | Chandrasekaran | H01L 21/565 257/680 |
| 2012/0074599 | A1 * | 3/2012 | Kim | H01L 21/565 257/793 |

FOREIGN PATENT DOCUMENTS

| | | |
|---|---|---|
| WO | 2009018193 | 2/2009 |
| WO | 2010008931 | 1/2010 |

* cited by examiner

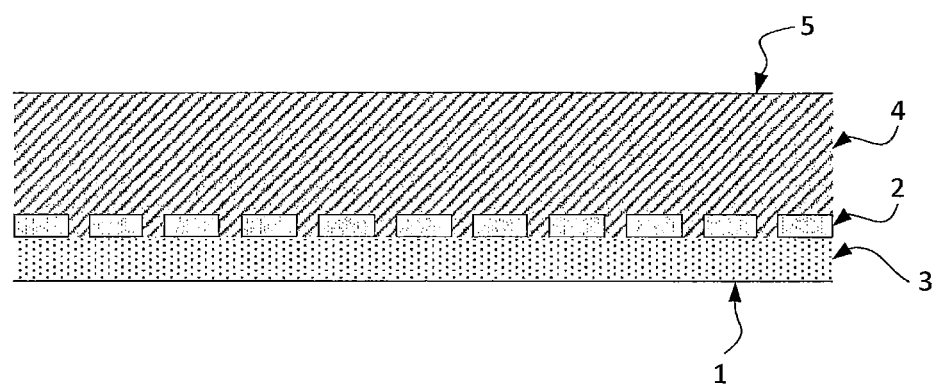

METHODS TO CONTROL WAFER WARPAGE UPON COMPRESSION MOLDING THEREOF AND ARTICLES USEFUL THEREFOR

FIELD OF THE INVENTION

The present invention relates to multilayer structures having a reduced propensity to warp upon curing of certain components thereof. In one aspect, the invention relates to multilayer assemblies comprising a plurality of the above-described multilayer structures. In another aspect, the invention relates to methods for reducing wafer warpage upon cure of molding compositions applied thereto. In yet another aspect, the invention relates to methods for preparing wafers having substantially no warpage upon cure thereof.

BRIEF DESCRIPTION OF RELATED TECHNOLOGY

Liquid compression molding for packaging applications in the semiconductor packaging industry involves the coating of a protective material on a carrier on which is disposed one or more diced silicon dies picked and then placed there. The gaps and edges around the silicon dies are filled with the protective material to form a molded wafer.

Conventional materials used to form the molded wafer have either not possessed the desired physical properties to offer improved resistance to wafer warpage, or have not lent themselves to application by liquid compression molding techniques.

SUMMARY OF THE INVENTION

In accordance with the present invention, there are provided multilayer structures having a reduced propensity to warp upon curing of certain components thereof. In one aspect, there are provided multilayer assemblies comprising a plurality of the above-described multilayer structures. In another aspect, there are provided methods for reducing wafer warpage upon cure of molding compositions applied thereto. In yet another aspect, there are provided methods for preparing wafers having substantially no warpage upon cure thereof.

The FIGURE is a schematic of a multilayer structure according to the present invention, wherein:
 1 is a silicon layer,
 2 is a plurality of chips,
 3 is an underfill layer underneath said chips,
 4 is a curable molding formulation, and
 5 is a reinforcing element.

DETAILED DESCRIPTION OF THE INVENTION

In accordance with the present invention, there are provided multilayer structures comprising:
 a silicon layer containing a plurality of chips on one face thereof and an underfill layer underneath said chips,
 a curable molding formulation applied to the same face as said plurality of chips, and
 a reinforcing element applied to said curable molding formulation,
 wherein the coefficient of thermal expansion (CTE) of the reinforcing element is sufficiently similar to the CTE of the silicon layer so as to minimize warping of said structure upon cure of said molding formulation.

As readily recognized by those of skill in the art, a variety of reinforcing elements can be employed in the practice of the present invention, e.g., a carbon fiber sheet, a thin glass sheet, a liquid crystal polymer (LCP) sheet, a silicon plate or sheet, a ceramic thin plate or sheet, or the like. In some embodiments, the reinforcing element employed in the practice of the present invention is a silicon plate or sheet.

Ceramic thin plates or sheets contemplated for use herein can be made from a variety of materials, e.g., silicon carbide, silicon nitride, alumina, alumina oxide, alumina-zirconia, aluminum-nitride, aluminum silicate, boron carbide, boron nitride, calcium aluminate, carbon, ceria, cordierite, forsterite, graphite, hafnia, hafnium oxide, kaolin, clay-based magnesia or magnesite, metal boride, mullite, rare earth oxides (REO), porcelain, sapphire, silica, fused silica, silicide, steatite, yttria, tungsten carbide, zircon, zirconium phosphate, and the like. In some embodiments, the ceramic thin plates or sheets are made from silicon carbide, silicon nitride, boron carbide, boron nitride, tungsten carbide, and the like.

In certain embodiments, the CTE of reinforcing elements contemplated for use herein is <8 ppm/° C. In some embodiments, the CTE of reinforcing elements contemplated for use herein falls in the range of about 0-6 ppm/° C. In some embodiments, the CTE of reinforcing elements contemplated for use herein falls in the range of about 0-5 ppm/° C.

Silicon layers contemplated for use herein typically have a CTE in the range of about 2-3 ppm/° C. In some embodiments, the CTE of the reinforcing element is ±100% of the CTE of the silicon layer.

In some embodiments, the CTE of the reinforcing element is ±90% of the CTE of the silicon layer; in some embodiments, the CTE of the reinforcing element is ±80% of the CTE of the silicon layer; in some embodiments, the CTE of the reinforcing element is ±70% of the CTE of the silicon layer; in some embodiments, the CTE of the reinforcing element is ±60% of the CTE of the silicon layer; in some embodiments, the CTE of the reinforcing element is ±50% of the CTE of the silicon layer; in some embodiments, the CTE of the reinforcing element is ±40% of the CTE of the silicon layer; in some embodiments, the CTE of the reinforcing element is ±30% of the CTE of the silicon layer; in some embodiments, the CTE of the reinforcing element is ±20% of the CTE of the silicon layer; in some embodiments, the CTE of the reinforcing element is ±10% of the CTE of the silicon layer; in some embodiments, the CTE of the reinforcing element is ±5% of the CTE of the silicon layer.

Curable molding formulations contemplated for use herein comprise a curable resin matrix containing 80-95 wt % inorganic filler.

Exemplary inorganic fillers include silica, alumina, aluminum oxide, aluminum silicate, silicon nitride, aluminum nitride, silica-coated aluminum nitride, boron carbide, boron nitride, carbon black, and the like, as well as combinations of any two or more thereof.

Molding formulations contemplated for use herein can be characterized by at least the following performance properties:
 being moldable within about 30 min at a temperature in the range of 100° C. to 200° C. (in some embodiments, within about 20 minutes at a temperature in the range of 100° C. to 200° C.; in some embodiments within about 10 minutes at a temperature in the range of 100° C. to 200° C.; in some embodiments, within about 30 minutes at a temperature in the range of 100° C. to 150° C.; in some embodiments within about 20 minutes at a temperature in the range of 100° C. to 150° C.; and in some embodiments, within about 10 minutes at a temperature in the range of 100° C. to 150° C.), being curable within 8 hours at a temperature in the range of 100° C. to 175° C. (in some embodiments, within about 6 hours; in some embodiments within about 4 hours; and in some embodiments within about 2 hours), having a low CTE (alpha 1<30 ppm/° C.; in some embodiments, <20 ppm/° C.; and in some embodiments, <10 ppm/° C.), having high temperature stability (i.e., low weight loss <1.0% at 250° C.), and having a Tg>50° C. (in some embodiments, <60° C.; in some embodiments, <70° C.; in some embodiments, <80° C.; and in some embodiments, <90° C.).

Exemplary curable molding formulations which meet the preceding criteria include liquid compression molding formulations, powder compression molding formulations, compression molding films, panel molding formulations, and the like.

Exemplary curable resin matrices comprise (1) an epoxy resin matrix alone; (2) the combination of an epoxy resin component and a (meth)acrylate functional polymer component; (3) the combination of an epoxy resin component and a phenolic novolac component; and the like.

Exemplary epoxy resin matrices include epoxies made from bisphenol A, bisphenol F, bisphenol S, bisphenol E, biphenyl or combinations thereof. In addition, two or more different bisphenol epoxies (or hydrogenated versions thereof) within the same type of resin (such as A, F, S or E) may be used.

Commercially available examples of the bisphenol epoxies desirable for use herein include bisphenol-F epoxies [such as RE-404-S from Nippon Kayaku, Japan, and EPICLON 830 (RE1801), 830S (RE1815), 830A (RE1826) and 830W from Dai Nippon Ink & Chemicals, Inc., and RSL 1738 and YL-983U from Resolution] and bisphenol-A epoxies (such as YL-979 and 980 from Resolution).

The bisphenol epoxies available commercially from Dai Nippon and noted above are promoted as liquid undiluted epichlorohydrin-bisphenol F epoxies having lower viscosities than conventional epoxies based on bisphenol A epoxies and have physical properties similar to liquid bisphenol A epoxies. Bisphenol F epoxy has a lower viscosity than bisphenol A epoxy, all else being the same between the two types of epoxies, which affords a lower viscosity and thus a fast flow underfill sealant material. The EEW of these four bisphenol F epoxies is between 165 and 180. The viscosity at 25° C. is between 3,000 and 4,500 cps (except for RE1801 whose upper viscosity limit is 4,000 cps). The bisphenol A epoxies have a EEW (g/eq) of between 180 and 195 and a viscosity at 25° C. of between 100 and 250 cps.

The bisphenol epoxies available commercially from Resolution and noted above are promoted as low chloride containing liquid epoxies. The total chloride content for the RSL-1738 bisphenol A epoxy is reported as between 500 and 700 ppm, and that for YL-983U as between 150 and 350 ppm.

Among the epoxies suitable for use herein also include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

In addition to the bisphenol epoxies, other epoxy compounds may be included within the epoxy component. For instance, cycloaliphatic epoxies, such as 3,4-epoxycyclohexylmethyl-3,4-epoxycyclohexylcarbonate, or hydrogenated versions of the bisphenol or biphenyl epoxies may be used.

Also monofunctional, difunctional or multifunctional reactive diluents to adjust the viscosity and/or lower the Tg are used, such as butyl glycidyl ether, cresyl glycidyl ether, polyethylene glycol glycidyl ether or polypropylene glycol glycidyl ether. Appropriate monofunctional epoxy coreactant diluents for use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters and $C_{10-28}$ alkylphenol glycidyl ethers.

In the event such a monofunctional epoxy coreactant diluent is included, such coreactant diluent should be employed in an amount of up to about 5 percent by weight to about 15 percent by weight, such as about 8 percent by weight to about 12 percent by weight, based on the total weight of the composition.

The epoxy resin component should be present in the composition in an amount which the range of about 10 percent by weight to about 95 percent by weight, desirably about 20 percent by weight to about 80 percent by weight, such as about 60 percent by weight.

Optional (meth)acrylate functional polymer components contemplated for use herein include polymethyl methacrylate ("PMMA") and polybutyl acrylate ("PB") may be used too. Polymer materials within this class are referred to as polymethylmethacrylate-block-polybutylacrylate-block polymethylmethacrylate copolymers ("MAM").

Optional phenolic novolac components contemplated for use herein may be a thermoplastic, such as is available commercially from SI Group under the tradename REZICURE 3700. REZICURE 3700 is based on the diallyl bisphenol F structure and is promoted by the manufacturer as a liquid high-purity, novolak hardener for epoxy.

Other examples are MEH-8000H and MEH-8005 from Meiwa Plastic Ind. Ltd.

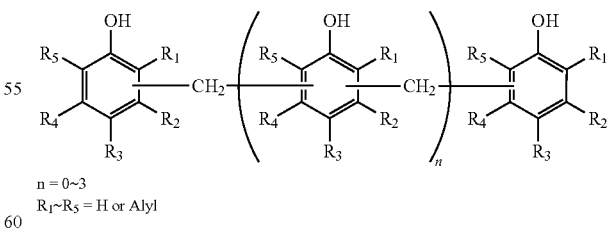

n = 0~3
$R_1$~$R_5$ = H or Alyl

MEH-8000H is reported by the manufacturer to be a low viscosity resin with a 25° C. viscosity of about 1,500 to 3,500 Mpa·s and with an OH equivalent value of about 139 to 143; MEH-8005 is a high viscosity version with a 25° C. viscosity of about 4,500 to 7,500 Mpa·s and with an OH equivalent value of about 133 to 138.

Additional reactive components which may be included in formulations employed in the practice of the present invention include episulfide resin components, oxazine components, oxazoline components, cyanate ester components, maleimide-, nadimide- or itaconimide-containing components.

As an episulfide resin, any of the aforementioned epoxies may be used where the oxirane oxygen atom has been replaced by a sulfur atom.

Oxazines may be embraced by the structure:

$$\left[ R_2 \underset{R_3}{\overset{R_1}{\underset{R_4}{\triangle}}}\!\!\!\overset{m}{\underset{N}{\overset{O}{\diagup}}}\!\!\!-\!X\!-\!\left(\underset{O}{\overset{N}{\diagup}}\!\!\!\underset{n}{\triangle}\!\!\!\overset{R_5}{\underset{R_8}{\underset{R_7}{\overset{R_6}{}}}}\right)_k \right]$$

where $R_1$-$R_8$ are each individually members selected from hydrogen, $C_{1-40}$ alkyl, $C_{2-40}$ alkenyl, the latter two of which being optionally interrupted by one or more of O, N, S, C=O, COO, or NHC=O or substituted by one or more of OH, OR, NRR, SH, SR, COOH, COOR, NHCOOH or NHCOOR, where R is selected from $C_{1-40}$ alkyl, $C_{2-40}$ alkenyl, or $C_{6-20}$ aryl, X is a linkage selected broadly from alkylene, alkenylene, or arylene, optionally interrupted by one or more of O, NR, S, C=O, COO, or NHC=O or substituted by one or more of OH, OR, NRR, SH, SR, COOH, COOR, NHCOOH or NHCOOR, where R is selected from $C_{1-40}$ alkyl, $C_{2-40}$ alkenyl, or $C_{6-20}$ aryl, m and n are each individually 1 or 2, and k is 0 to 6.

The oxazine resin component should be present in the composition in an amount which the range of about 10 percent by weight to about 95 percent by weight, desirably about 20 percent by weight to about 80 percent by weight, such as about 60 percent by weight.

A more specific example of the oxazine resin component is a benzoxazine resin, examples of which may be embraced by $$\left[\begin{array}{c}\text{benzoxazine structure with } R_1, N, O\end{array}\right]_o\!-\!X$$

where o is 1-4, X is defined below, and $R_1$ is alkyl, such as methyl, ethyl, propyls or butyls, or $$\left[\begin{array}{c}\text{benzoxazine structure with } R_4, O, N\end{array}\right]_p\!-\!Y$$

where p is 1-4, Y is defined below, and $R_4$ is selected from hydrogen, halogen, alkyl or alkenyl.

X and Y in the benzoxazine structures above may independently be selected from a monovalent or polyvalent radical that include hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, aryalkenyl, alkenylaryl, arylalkynyl or alkynylaryl, provided, however, that X can be aryl only when X comprises a combination of two or more different species;

hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalkynylene or alkynylarylene, heterocyclic or substituted heterocyclic species typically having in the range of about 6 up to about 500 carbon atoms, polysiloxane, and polysiloxane-polyurethane block copolymers, and combinations of one or more of the above with a linker selected from covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—; where each R is independently hydrogen, alkyl or substituted alkyl.

When one or more of the above described "X" or "Y" linkages cooperate to form the appendage of a benzoxazine group, as readily recognized by those of skill in the art, a wide variety of organic chains can be produced, such as, for example, oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, carboxyheteroatom-containing di- or polyvalent cyclic moiety, and the like.

The benzoxazine resin component should be present in the composition in an amount which the range of about 10 percent by weight to about 95 percent by weight, desirably about 20 percent by weight to about 80 percent by weight, such as about 60 percent by weight.

As a cyanate ester component, compounds having the general structural formula below may be used:

$$R^1\text{--(O--C}\equiv\text{N)}_m \qquad (I)$$

where m is from 2 to 5 and $R^1$ is an aromatic nucleus-containing residue. $R^1$ should contain at least 6 carbon atoms and may be derived, for example, from aromatic hydrocarbons, such as benzene, biphenyl, naphthalene, anthracene, pyrene or the like. The aromatic residue may be also be derived from a polynuclear aromatic hydrocarbon in which at least two aromatic rings are attached to each other through a bridging group, such as where the bridging member has the formula

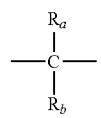

where $R_a$ and $R_b$ are the same or different and each represents a hydrogen atom or an alkyl group containing 1 to 4 carbon atoms. $R^1$ also includes residues derived from novolac-type phenolic resins—i.e. cyanate esters of these phenolic resins. $R^1$ may also contain further ring attached, non-reactive substituents.

Examples of useful cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-ticyanatonaphthalene; 4,4'-dicyanatobiphenyl; bis(4-cyanatophenyl)methane and 3,3',5,5'-tetramethyl, bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-(methylethylidene)]benzene and cyanated, bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Patent No. 1,305,702, and the cyanate esters disclosed in International Patent Publication No. WO 85/02184, the disclosure of each of which is hereby expressly incorporated herein by reference.

Particularly desirable cyanate esters for use herein are available commercially from Hunstman Advanced Materials, Tarrytown, N.Y. under the tradename "AROCY" [1,1-di(4-cyanatophenylethane)]. The structures of four desirable "AROCY" cyanate esters are

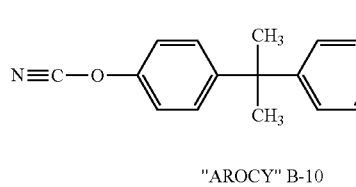

"AROCY" B-10

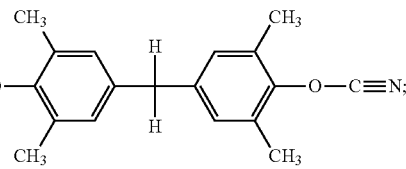

"AROCY" M-30

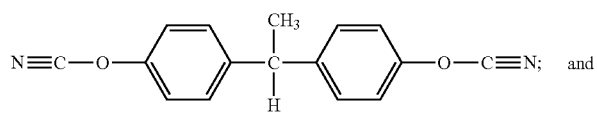

"AROCY" L-10

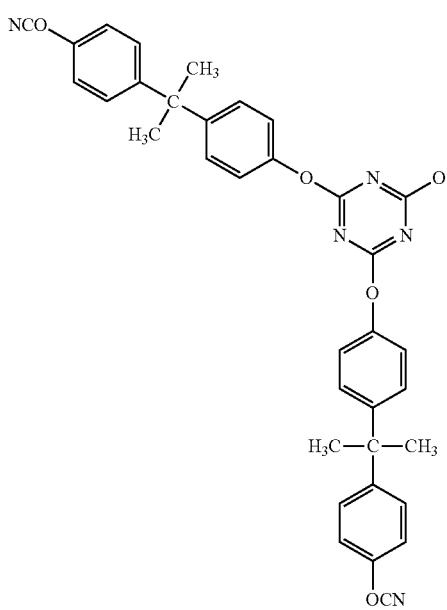

"AROCY" B-30

The cyanate ester resin component should be present in the composition in an amount which the range of about 10 percent by weight to about 95 percent by weight, desirably about 20 percent by weight to about 80 percent by weight, such as about 60 percent by weight.

As a maleimide, nadimide or itaconimide, compounds having the general respective structural formulae below may be used:

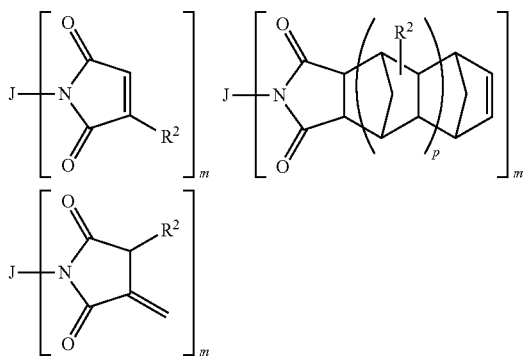

where m is 1-15, p is 0-15, each $R^2$ is independently selected from hydrogen or lower alkyl (such as $C_{1-5}$), and J is a monovalent or a polyvalent radical comprising organic or organosiloxane radicals, and combinations of two or more thereof, such as are defined as "X" and "Y" with respect to the benzoxazine structure above.

Monovalent or polyvalent radicals include hydrocarbyl or substituted hydrocarbyl species typically having a range of about 6 up to about 500 carbon atoms. The hydrocarbyl species may be alkyl, alkenyl, alkynyl, cycloalkyl, cycloalkenyl, aryl, alkylaryl, arylalkyl, aryalkenyl, alkenylaryl, arylalkynyl and alkynylaryl.

Additionally, X may be a hydrocarbylene or substituted hydrocarbylene species typically having in the range of about 6 up to about 500 carbon atoms. Examples of hydrocarbylene species include but are not limited to alkylene, alkenylene, alkynylene, cycloalkylene, cycloalkenylene, arylene, alkylarylene, arylalkylene, arylalkenylene, alkenylarylene, arylalkynylene and alkynylarylene.

The maleimide, itaconamide or nadimide may be in liquid or solid form.

In certain embodiments, the maleimide, itaconamide or nadimide functional groups are separated by a polyvalent radical having sufficient length and branching to render the maleimide containing compound a liquid. The maleimide, itaconamide or nadimide compound may contain a spacer between maleimide functional groups comprising a branched chain alkylene between maleimide, itaconamide or nadimide functional groups.

In the case of maleimide-containing compounds, the maleimide compound desirably is a stearyl maleimide, oleyl maleimide, a biphenyl maleimide or a 1,20-bismaleimido-10,11-dioctyl-eixosane or combinations of the above.

Again in the case of maleimide-containing compounds, the maleimide compound may be prepared by reaction of maleic anhydride with dimer amides or prepared from aminopropyl-terminated polydimethyl siloxanes, polyoxypropylene amines, polytetramethyleneoxide-di-p-aminobenzoates, or combinations thereof.

Particularly desirable maleimides and nadimides include

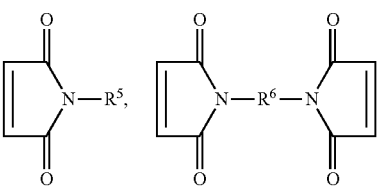

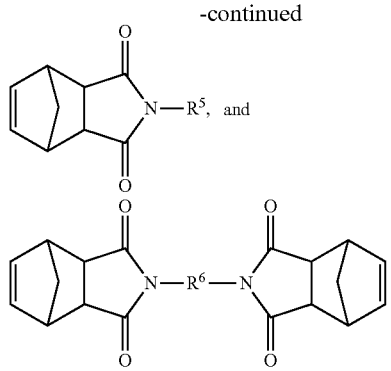

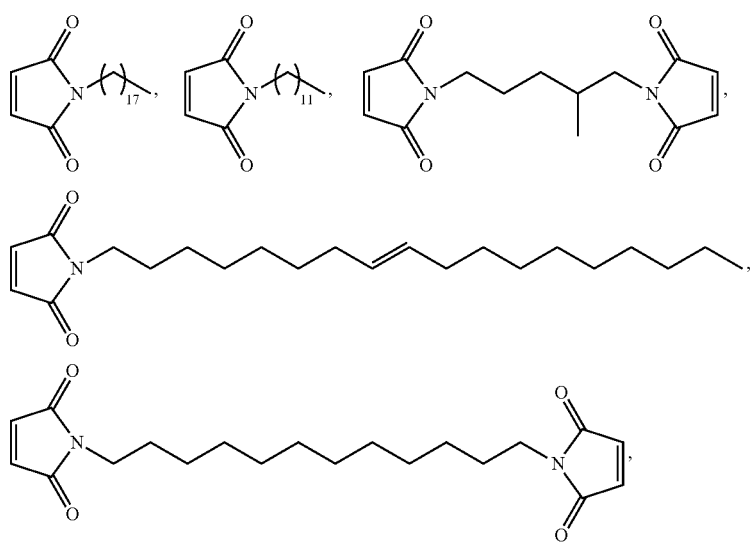

where $R^5$ and $R^6$ are each selected from alkyl, aryl, aralkyl or alkaryl groups, having from about 6 to about 100 carbon atoms, with or without substitution or interruption by a member selected from silane, silicon, oxygen, halogen, carbonyl, hydroxyl, ester, carboxylic acid, urea, urethane, carbamate, sulfur, sulfonate and sulfone.

Other desirable maleimides, nadimides, and itaconimides include

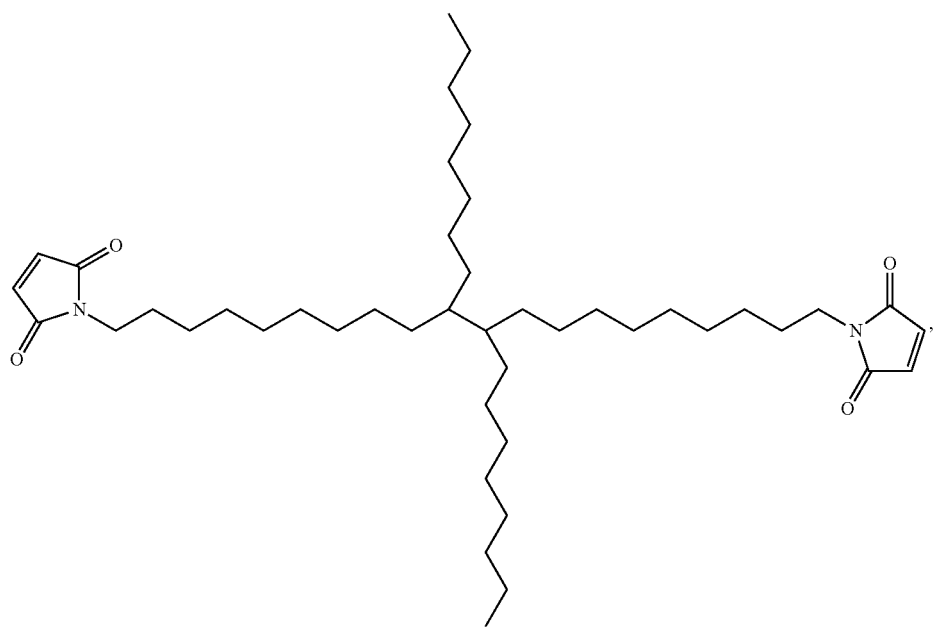

-continued
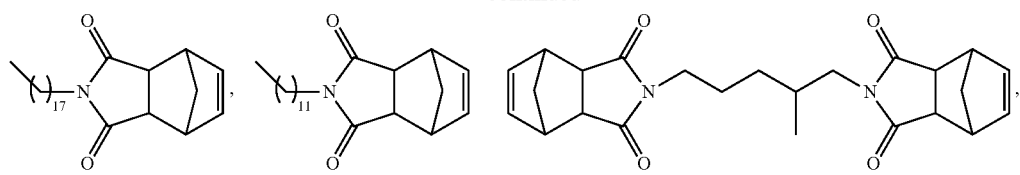
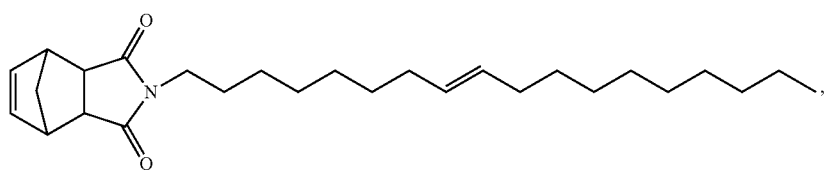
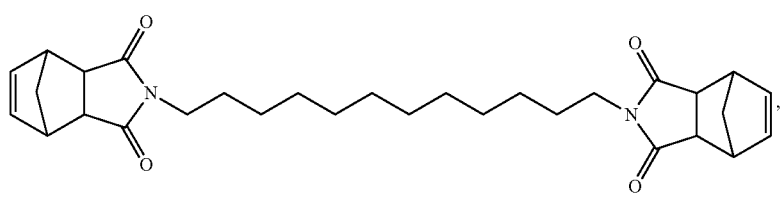
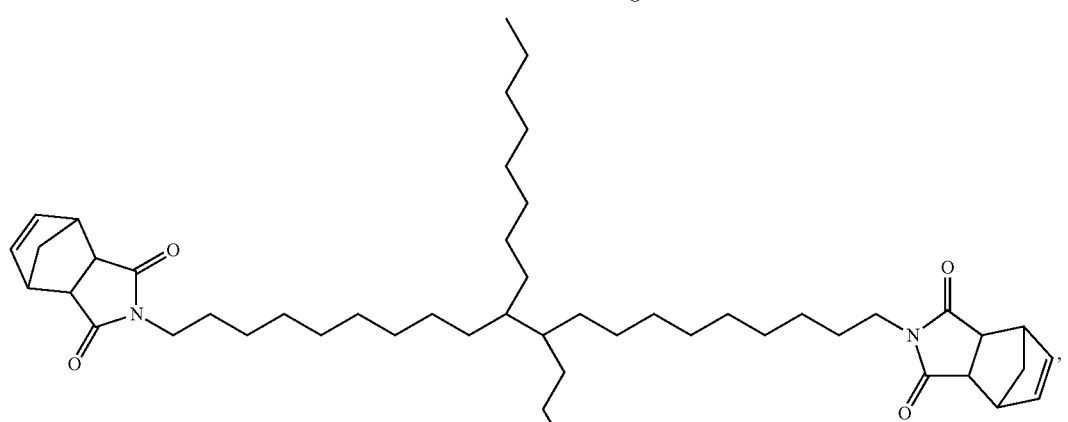
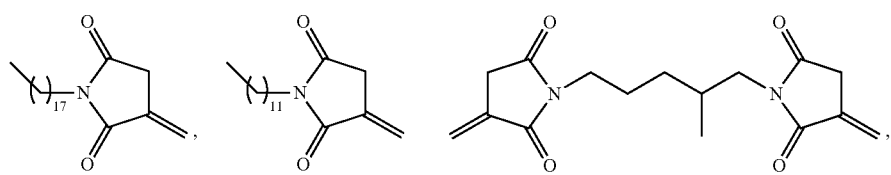
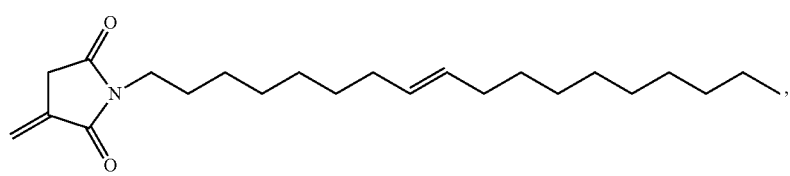
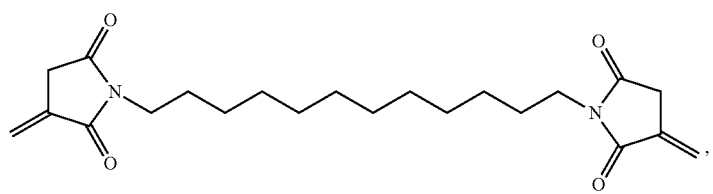

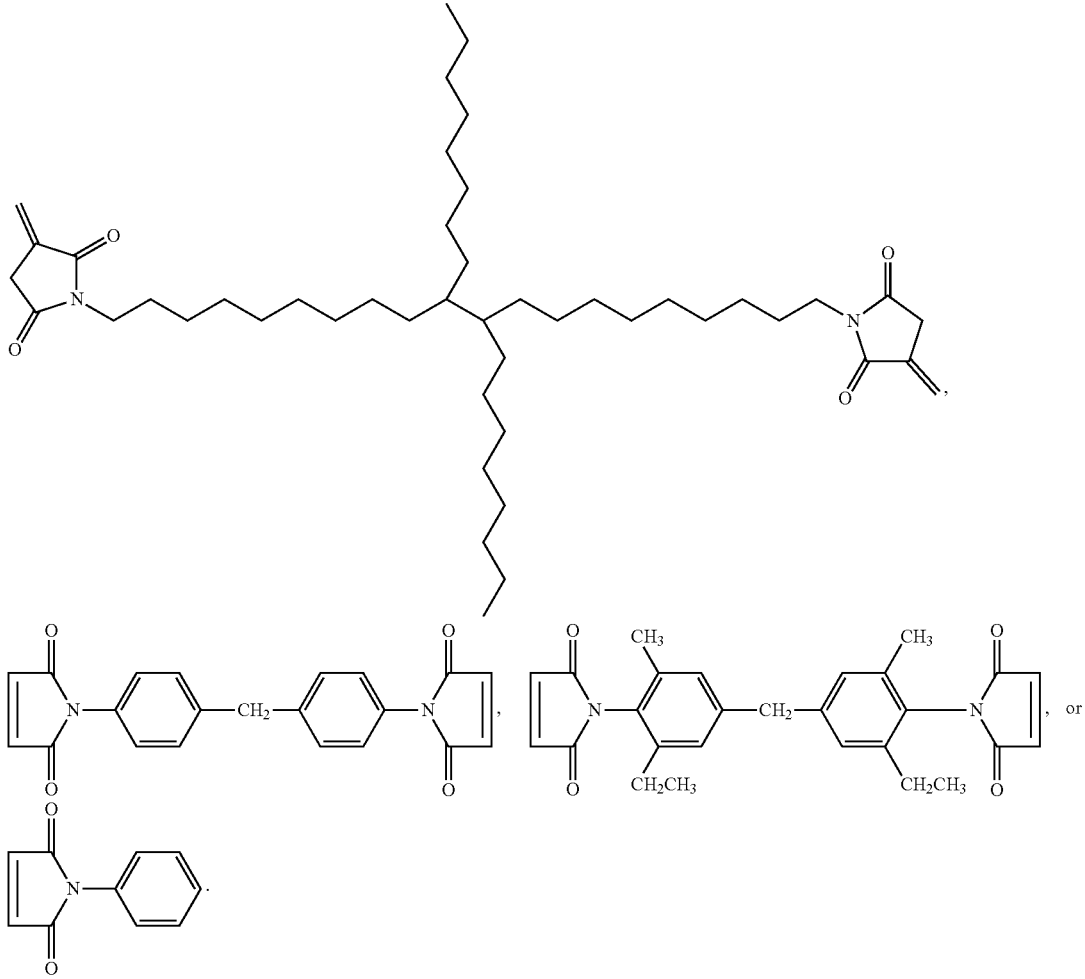

The maleimides, nadimides or itaconimides should be present in the composition in an amount which the range of about 10 percent by weight to about 95 percent by weight, desirably about 20 percent by weight to about 80 percent by weight, such as about 60 percent by weight.

The block copolymer may be any block copolymer capable of contributing to the physical properties desired for the disclosed composition Amphiphilic block copolymers are particularly desirable. Arkema offers for sale commercially an amphiphilic block copolymer under the trademark Nanostrength. Such block copolymers are currently available in two versions: SBM and MAM. The SBM copolymer is reportedly made of polystyrene, 1,4-polybutadiene and syndiotactic poly(methyl methacrylate).

In addition, a polymer material constructed from polymethyl methacrylate ("PMMA") and polybutyl acrylate ("PB") may be used too. Polymer materials within this class are referred to as polymethylmethacrylate-block-polybutylacrylate-block polymethylmethacrylate copolymers ("MAM").

As reported by Arkema, MAM is a triblock copolymer, consisting of about 70% PMMA and 30% PB. MAM is constructed from distinct segments, which provides for the ability to self-assemble at the molecular scale. That is, M confers hardness to the polymer and A confers elastomeric properties to the polymer. A hard polymer segment tends to be soluble in cyanoacrylates, whereas the elastomeric segments provides toughness to the polymeric cyanoacrylate which forms upon cure. MAM also reinforces mechanical properties, without compromising inherent physical properties. MAM is commercially available under the tradename Nanostrength, at present under several different grades E-21 [intermediate low molecular weight, medium butadiene content best toughening for PMMA friendly cross-linking agents (JEFFAMINE, MDEA)], E-41 [low molecular weight, low butadiene content, low viscosity, for use with PMMA friendly cross-linking agents (JEFFAMINE, MDEA)], M-22, M-22N, M-42, M-51 (low molecular weight, medium butyl acrylate content, low viscosity), and M-52N.

Arkema promotes the Nanostrength product line as an acrylic block copolymer that is miscible with many polymers, most of which according to the manufacturer are major industrial epoxy resins. See also U.S. Pat. No. 6,894,113, where in its abstract the '113 patent speaks to a thermoset material with improved impact resistance. The impact resistance is derived from 1 to 80% of an impact modifier comprising at least one copolymer comprising S-B-M, B-M and M-B-M blocks, where each block is connected to the other by a covalent bond or of an intermediary connected to one of the blocks by a covalent bond and to the other block by another covalent bond, M is a PMMA homopolymer or a copolymer comprising at least 50% by weight of methyl methacrylate, B is incompatible with the thermoset resin and with the M block and its glass transition temperature Tg is less than the operating temperature of the thermoset material, and S is incompatible with the thermoset resin, the B block and the M block and its Tg or its melting temperature is greater than the Tg of B.

Another commercially available example of an amphiphilic block copolymer is a polyether block copolymer known to the trade as FORTEGRA 100, from Dow Chemical Co. Dow describes FORTEGRA 100 as a low viscosity toughening agent designed for use as a high efficiency second phase, in amine cured epoxy systems. FORTEGRA 100 is reported to provide improved toughness without significantly affecting the viscosity, glass transition temperature, corrosion resistance, cure rate or chemical resistance of the final coating or composition. FORTEGRA 100 is also reported to be useful for formulation into standard bisphenol A and bisphenol F epoxy systems as it does not participate in the epoxy cure reaction. As a second phase toughening agent, FORTEGRA 100 is promoted as being effective when formulated at a specific volume fraction of the finish film or part, typically 3% to 8% by dry volume is said to achieve the toughening effect.

Additional block copolymers include those which comprise both hydrophobic and hydrophilic segments or portions, of the general formula:

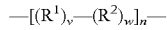

where $R^1$ is independently a hydrophobic olefin, such as ethylene, propylene, 1-butene, 1-hexene, 3-methyl-1-pentene, or 4-methyl-1-pentene or a polymerizable hydrophobic aromatic hydrocarbon such as styrene; each $R^2$ is a hydrophilic acid anhydride, such as maleic anhydride; v is from 1 to 12; w is from 1 to 6; and n is from 1 to 50.

Still other block copolymers may be a styrene maleic anhydride copolymer, represented by the formula:

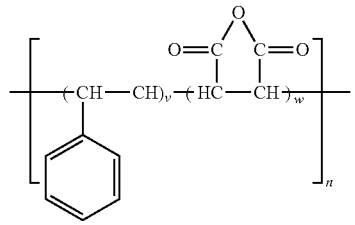

where v is from 1 to 12; w is from 1 to 6; and n is from 1 to 50.

Styrene maleic anhydride copolymers are well known and some of which are available commercially from Sartomer Company, Inc., Exton, Pa. under the trade name SMA EF80, for example. Styrene maleic anhydride copolymers represent the copolymerization product of styrene and maleic anhydride and are characterized by alternating blocks of styrene and maleic anhydride moieties.

The ratio of the hydrophobic segments to the hydrophilic segments in the styrene maleic anhydride block copolymer may be at least 2:1, such as between 3:1 and 12:1. The hydrophilic segments in the block copolymer should comprise an anhydride, such as maleic anhydride. The hydrophobic segments in the block copolymer should comprise at least one of ethylene, propylene, 1-butene, 1-hexene, 3-methyl-1-pentene, 4-methyl-1-pentene, or styrene. Desirably, the block copolymer should be prepared with the hydrophilic segments comprising maleic anhydride and the hydrophobic segments comprising styrene.

Reference to the following U.S. patent documents shows amphiphilic block copolymers suitable for use herein, and as such are incorporated herein by reference. U.S. Pat. No. 7,745,535 is directed to and claims an amphiphilic multi-block copolymer where at least one block is a profiled block consisting of a) a hydrophilic middle block made from one or more monomeric units selected from acrylic acid, methacrylic acid, and the salts, esters, anhydrides and amides of acrylic acid and methacrylic acid; dicarboxylic acid anhydrides; carboxyethyl acrylate; and acrylamides; and b) hydrophobic end blocks where the multiblock copolymer is water insoluble, water indisperible, and not soluble or dispersible in $C_{1-3}$ alcohols.

U.S. Pat. No. 7,820,760 is directed to and claims a curable adhesive epoxy resin composition including (a) an epoxy resin; (b) an amphiphilic block copolymer containing at least one epoxy resin miscible block segments and at least one epoxy resin immiscible block segments (where the immiscible block segment comprises at least one polyether structure provided that the polyether structure of the immiscible block segment contains at least one or more alkylene oxide monomer units having at least four carbon atoms); and (c) at least one curing agent. The amphiphilic block copolymer in the '760 patent is an all polyether block copolymer such as a PEO-PBO diblock copolymer or a PEO-PBO-PEO triblock copolymer. The amphiphilic block copolymer is present in an amount such that when in the '760 patent the epoxy resin composition is cured, the bond strength of the resulting cured epoxy adhesive resin composition increases compared to an epoxy resin composition without the amphiphilic polyether block copolymer.

U.S. Pat. No. 7,670,649 is directed to and claims a curable ambient cure high-solids coating composition including (a) an epoxy resin; (b) an amphiphilic block copolymer containing at least one epoxy resin miscible block segment (where the immiscible block segment comprises at least one polyether structure provided that the polyether structure of the immiscible block segment contains at least one or more alkylene oxide monomer units) and at least one epoxy resin immiscible block segment; and (c) a sufficient amount of a nitrogen-containing curing agent to cure the coating composition at ambient temperature of less than about 60° C. When the epoxy resin composition is cured, the toughness of the resulting cured epoxy resin composition is increased.

U.S. Pat. No. 6,887,574 is directed to and claims a curable flame retardant epoxy resin composition including (a) at least one flame retardant epoxy resin; (b) at least one amphiphilic block copolymer; and (c) a curing agent. Such components are present in the curable composition in the appropriate amounts and ratios such that, upon curing, the block copolymer self-assembles into a nano structure morphology, such as a worm-like micelle morphology. The resulting cured product is reported to have a remarkably increased high fracture resistance; and allows the use of flame retardant epoxies in applications where fracture resistance is an issue.

U.S. Patent Application Publication No. 2008/0287595 is directed to a composition comprising (1) a thermosettable resin selected from an epoxy resin, an epoxy vinyl ester resin, an unsaturated polyester resin or a mixture thereof, and (2) an amphiphilic mock copolymer dispersed in the thermosettable resin. In addition, fiber-reinforced plastics (FRP), coatings and composites prepared from the composition are provided as well.

International Patent Publication No. WO 2010/008931 is directed to a structural composite that uses a block copolymer toughening agent to increase the fracture resistance (toughness) of the structural composite. The structural composite comprises (i) a carbon fiber reinforcing material and (ii) a thermosettable resin composition; wherein the thermosettable resin composition comprises (a) a thermosettable resin and (b) at least one block copolymer toughening agent.

International Patent Publication No. WO 2009/018193 is directed to curable compositions, cured compositions, and methods of forming the same, including an epoxy resin, a curing agent, an amphiphilic toughening agent, and an inorganic nanofiller, where the toughening agent forms a second phase having at least one dimension being on the nanometer scale.

Another example of a block polymer that may be used herein is a silane modified epoxy resin, which is made from:
(A) an epoxy component embraced by the following structure:

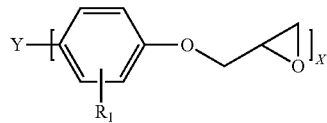

where Y may or may not be present and when Y present is a direct bond, $CH_2$, $CH(CH_3)_2$, $C=O$, or S, $R_1$ here is alkyl, alkenyl, hydroxy, carboxy and halogen, and x here is 1-4;
(B) a polymeric form of an epoxy-functionalized alkoxy silane embraced by the following structure:

$$R^1-Si(OR^2)_3$$

where $R^1$ is an oxirane-containing moiety and $R^2$ is an alkyl or alkoxy-substituted alkyl, aryl, or aralkyl group having from one to ten carbon atoms; and
(C) reaction products of components (A) and (B).

An example of one such silane-modified epoxy is formed as the reaction product of an aromatic epoxy, such as a bisphenol A, E, F or S epoxy or biphenyl epoxy, and epoxy silane where the epoxy silane is embraced by the following structure:

$$R^1-S(OR^2)_3$$

where $R^1$ is an oxirane-containing moiety, examples of which include 2-(ethoxymethyl)oxirane, 2-(propoxymethyl) oxirane, 2-(methoxymethyl)oxirane, and 2-(3-methoxypropyl)oxirane and $R^2$ is an alkyl or alkoxy-substituted alkyl, aryl, or aralkyl group having from one to ten carbon atoms. In one embodiment, $R^1$ is 2-(ethoxymethyl)oxirane and $R^2$ is methyl.

Idealized structures of the aromatic epoxy used to prepare the silane modified epoxy composition of matter include in one aspect is thus

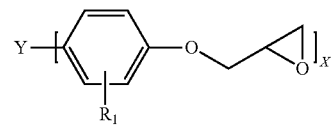

where Y may or may not be present and when Y is present, Y is a direct bond, $CH_2$, $CH(CH_3)_2$, $C=O$, or S, $R_1$ here is alkyl, alkenyl, hydroxy, carboxy and halogen, and x here is 1-4. Of course, when x is 2-4, chain extended versions of the aromatic epoxy are also contemplated as being embraced by this structure.

For instance, a chain extended version of the aromatic epoxy may be embraced by the structure below

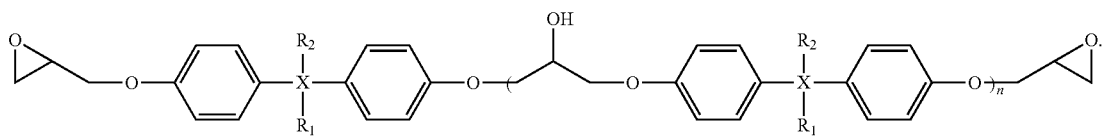

The silane modified epoxy is thus in one aspect a combination of the aromatic epoxy, a polymeric form of the epoxy silane, and reaction products of the aromatic epoxy and the epoxy silane. The reaction products may be prepared from the aromatic epoxy and epoxy silane in a by weight ratio of 1:100 to 100:1, such as a by weight ratio of 1:10 to 10:1.

The block copolymer may be used herein in an amount up to about 50 percent by weight, desirably from 5 to 40 percent by weight based on the total weight of the adhesive composition.

The Tg of a polymer is the temperature at which the polymer becomes brittle on cooling or soft on heating. More specifically, Tg defines a pseudo second order phase transition in which a polymer yields, on cooling, a glassy structure with properties similar to those of a crystalline material. Above Tg, the polymer becomes soft and capable of plastic deformation without fracture. While the Tg is occasionally described as the "softening temperature" of a polymer, it is not uncommon for the polymer to begin softening at a temperature below the Tg. This is because, due to the nature of many non-crystalline polymers, the softening of the polymer may occur over a temperature range rather than abruptly at a single temperature value. Tg generally refers to the middle point of this range even though the polymer may begin to soften at a different temperature. For purposes of this application, the Tg of a polymer refers to the value as determined by ASTM E-1356.

In addition to becoming brittle at temperatures below Tg, a polymer also generally becomes drier and less tacky than when that same polymer is heated to a temperature above its Tg.

Another block copolymer is the chain extended reaction product of diglycidyl ethers and bisphenol A together with the diglycidyl ether of bisphenol A. More specifically, depending on the molecular weight of the diglycidyl ether (for instance, polypropylene glycol diglycidyl ether) on higher or lower viscosity block copolymer can be obtained.

In accordance with another aspect of the present invention, there are provided multilayer structures as described herein wherein the curable molding formulation has been cured.

Among the benefits of the present invention, the articles produced by curing the curable molding formulation undergo at least 20% less warpage than an article prepared from a structure having no reinforcing element thereon. In some embodiments, articles according to the present invention undergo at least 30% less warpage than an article prepared from a structure having no reinforcing element thereon; at least 40% less warpage than an article prepared from a structure having no reinforcing element thereon; at least 50% less warpage than an article prepared from a structure having no reinforcing element thereon; at least 60% less warpage than an article prepared from a structure having no reinforcing element thereon; at least 70% less warpage than an article prepared from a structure having no reinforcing element thereon; at least 80% less warpage than an article prepared from a structure having no reinforcing element thereon; at least 90% less warpage than an article prepared from a structure having no reinforcing element thereon; at least 95% less warpage than an article prepared from a structure having no reinforcing element thereon; at least 99% less warpage than an article prepared from a structure having no reinforcing element thereon.

The warpage of articles according to the invention upon cure of the curable molding formulation is sometimes evaluated with reference to the warpage observed with an 8" wafer. In some embodiments, an 8" wafer of a multilayer structure according to the invention undergoes <1 mm warpage upon cure; in some embodiments, an 8" wafer undergoes <0.9 mm warpage upon cure; <0.8 mm warpage upon cure; <0.7 mm warpage upon cure; <0.6 mm warpage upon cure; <0.5 mm warpage upon cure; <0.4 mm warpage upon cure; <0.3 mm warpage upon cure; <0.2 mm warpage upon cure; <0.1 mm warpage upon cure.

In some embodiments, the warpage of articles according to the invention upon cure of the curable molding formulation is sometimes evaluated with reference to the warpage observed with a 12" wafer. In some embodiments, a 12" wafer of a multilayer structure according to the invention undergoes <2 mm warpage upon cure; <1.9 mm warpage upon cure; <1.8 mm warpage upon cure; <1.7 mm warpage upon cure; <1.6 mm warpage upon cure; <1.5 mm warpage upon cure; <1.4 mm warpage upon cure; <1.3 mm warpage upon cure; <1.2 mm warpage upon cure; <1.1 mm warpage upon cure; <0.9 mm warpage upon cure; <0.8 mm warpage upon cure; <0.7 mm warpage upon cure; <0.6 mm warpage upon cure; <0.5 mm warpage upon cure; <0.4 mm warpage upon cure; <0.3 mm warpage upon cure; <0.2 mm warpage upon cure; <0.1 mm warpage upon cure.

For example, a compression molded silicon wafer may be placed into a conventional oven for a post mold cure at a temperature about 130° C. to 150° C. for a period of time of about 1 to 2 hours. Desirably, a 12", 50 um thick silicon wafer should demonstrate warpage less than about 2 mm, after post mold cure, or for 8" silicon wafers, less than about 1 mm bow across of the wafer.

A control sample prepared from bisphenol-A epoxy, cycloaliphatic epoxy and anhydride, without a reinforcing element, was applied to and molded on a silicon wafer, as described above. Warpage of the silicon wafer of more than 3 cm was observed using a Shadow Moirè, which uses non-contact and non-destructive methods to measure a whole-field surface topography of the molded wafers. In addition, warpage of more than 3 cm was observed by placing the molded wafer on a flat desk, and using a ruler to measure the height from the highest point of the curved wafer edge to the desk surface.

In contrast, structures including a reinforcing element showed little to no warpage after exposure to liquid compression molding conditions.

In an embodiment, structures of the present invention optionally comprise one or more through silica vias (TSV). The presence of TSVs facilitates preparation of multilayer assemblies comprising a plurality of such structures, stacked so as to form a plurality of dies in a single stack.

In yet another embodiment of the present invention, there are provided multilayer structures comprising:
   a silicon layer containing a plurality of chips thereon and an underfill layer underneath said chips,
   a cured molding formulation applied to the same face as said plurality of chips, and
   a reinforcing element applied to said molding formulation,
   wherein the coefficient of thermal expansion (CTE) of the reinforcing element is sufficiently similar to the CTE of the silicon layer so as to minimize warping of said structure upon cure of said molding formulation.

In still another embodiment, there are provided methods to reduce wafer warpage upon cure of a curable molding formulation applied to one side of a silicon support, said method comprising applying a reinforcing element to said curable molding formulation prior to curing thereof.

In accordance with the above-described method, wafer warpage upon cure is reduced by at least 20%. In some embodiments, wafer warpage is reduced by at least 30%; in some embodiments, wafer warpage is reduced by at least 40%; in some embodiments, wafer warpage is reduced by at least 50%; in some embodiments, wafer warpage is reduced by at least 60%; in some embodiments, wafer warpage is reduced by at least 70%; in some embodiments, wafer warpage is reduced by at least 80%; in some embodiments, wafer warpage is reduced by at least 90%; in some embodiments, wafer warpage is reduced by at least 95%; in some embodiments, wafer warpage is reduced by at least 99%.

In accordance with yet another aspect of the present invention, there are provided methods to prepare wafers having substantially no warpage upon cure thereof, said methods comprising:
   applying a curable molding formulation to one side of a silicon layer, then
   applying a reinforcing element to said curable molding formulation.

Thereafter, the curable molding formulation is cured after application of the reinforcing element to the curable molding formulation. The presence of the reinforcing element serves to reduce wafer warpage upon cure by at least 20%. In some embodiments, wafer warpage is reduced by at least 30%; in some embodiments, wafer warpage is reduced by at least 40%; in some embodiments, wafer warpage is reduced by at least 50%; in some embodiments, wafer warpage is reduced by at least 60%; in some embodiments, wafer warpage is reduced by at least 70%; in some embodiments, wafer warpage is reduced by at least 80%; in some embodiments, wafer warpage is reduced by at least 90%; in some embodiments, wafer warpage is reduced by at least 95%; in some embodiments, wafer warpage is reduced by at least 99%.

In accordance with still another aspect of the present invention, there are provided methods to prepare wafers having substantially no warpage upon cure thereof, said methods comprising applying a reinforcing element to one side of a silicon interposer having a curable molding formulation thereon, and thereafter curing the curable molding formulation after application of said reinforcing element to said molding formulation.

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

EXAMPLES

A reconfigured wafer is ordinarily constructed today to have an 8" or 12" diameter. In use, the thermosetting resin composition used to encapsulate the wafer may be dispensed by air pressure or by piston dispense on or about a central portion of the wafer.

Exposure to liquid compression molding conditions, such as a temperature of about 100° C. to 120° C. for a period of time of about 300 to 400 seconds, follows. After such exposure, the compression molded wafer may be placed into a conventional oven for a post mold cure at a temperature about 120° C. to 150° C. for a period of time of about 15 minutes to 1 hour. Desirably, an 8", 970 um thick molded wafer should demonstrate warpage about less than 1 mm bow across of the wafer.

A control sample (Sample No. 1) prepared from bisphenol-A epoxy, cycloaliphatic epoxy and anhydride, without a reinforcing element, is applied to a carrier on which is disposed silicon chips and molded as described above. Warpage of the molded wafer is observed to be modest using a Shadow Moirè in the X- and Y-directions, which uses non-contact and non-destructive methods to measure a whole-field surface topography of the molded wafers.

Using this technique, the warpage of the debonded wafer is measured. Then the wafer is annealed using a different temperature ramping process and the warpage is measured again.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. A multilayer structure comprising:
    a silicon layer containing a plurality of chips on one face thereof and an underfill layer underneath said chips,
    a curable molding formulation applied to the same face as said plurality of chips, and
    a reinforcing element applied to said curable molding formulation so as to minimize warping of said multilayer structure upon cure of said curable molding formulation,
    wherein the coefficient of thermal expansion (CTE) of the silicon layer falls in the range of about 2-3 ppm/° C., and the CTE of the reinforcing element is ±90% of the CTE of the silicon layer, and
    wherein said curable molding formulation is characterized as:
        being moldable within 30 minutes at a temperature in the range of 100° C. to 200° C.,
        being curable within 8 hours at a temperature in the range of 100° C. to 175° C.

2. The structure of claim 1 wherein said reinforcing element is a ceramic thin plate or sheet.

3. The structure of claim 2 wherein said ceramic thin plate or sheet comprises silicon carbide, silicon nitride, alumina, alumina oxide, alumina-zirconia, aluminum-nitride, aluminum silicate, boron carbide, boron nitride, calcium aluminate, carbon, ceria, cordierite, forsterite, graphite, hafnia, hafnium oxide, kaolin, clay-based magnesia or magnesite, metal boride, mullite, rare earth oxides (REO), porcelain, sapphire, silica, fused silica, silicide, steatite, yttria, tungsten carbide, zircon, or zirconium phosphate.

4. The structure of claim 2 wherein said ceramic thin plate or sheet comprises silicon carbide, silicon nitride, boron carbide, boron nitride or tungsten carbide.

5. The structure of claim 1 wherein said curable molding formulation comprises a curable resin matrix containing 80-95 weight % filler.

6. The structure of claim 5 wherein said filler is silica, alumina, aluminum oxide, aluminum silicate, silicon nitride, aluminum nitride, silica-coated aluminum nitride, boron carbide, boron nitride, carbon black, or a combination of any two or more thereof.

7. The structure of claim 5 wherein said curable molding formulation is further characterized as:
    having a CTE alpha 1<30 ppm/° C.,
    having weight loss <1.0% at 250° C., and
    having a Tg>50° C.

8. The structure of claim 7 wherein said curable molding formulation is a liquid compression molding formulation, a powder compression molding formulation, a compression molding film, or a panel molding formulation.

9. The structure of claim 7 wherein the article produced by curing undergoes at least 20% less warpage than an article prepared from a structure having no reinforcing element thereon.

10. The structure of claim 7 wherein an 8" wafer of said structure undergoes <1 mm warpage upon cure and/or a 12" wafer of said structure undergoes <2 mm warpage upon cure.

11. The structure of claim 1 wherein said silicon layer comprises one or more through silica vias (TSV).

12. A multilayer assembly comprising a plurality of structures according to claim 5 stacked so as to form a plurality of dies in a single stack.

13. The structure of claim 1 wherein said reinforcing element is a carbon fiber sheet, a thin glass sheet, a liquid crystal polymer (LCP) sheet, or a silicon plate or sheet.

14. A multilayer structure comprising:
    a silicon layer containing a plurality of chips thereon and an underfill layer underneath said chips,
    a cured molding formulation applied to the same face as said plurality of chips, and
    a reinforcing element applied to said cured molding formulation so as to minimize warping of said multilayer structure upon cure of said cured molding formulation,
    wherein the coefficient of thermal expansion (CTE) of the silicon layer falls in the range of about 2-3 ppm/° C., and the CTE of the reinforcing element is ±90% of the CTE of the silicon layer, and wherein said cured molding formulation is characterized as:
being moldable within 30 minutes at a temperature in the range of 100° C. to 200° C., and
being curable within 8 hours at a temperature in the range of 100° C. to 175° C.

15. A method to reduce wafer warpage upon cure of a curable molding formulation applied to one side of a silicon support, said method comprising applying a reinforcing element to said curable molding formulation so as to minimize warping of said silicon support upon cure of said curable molding formulation prior to curing thereof, wherein the coefficient of thermal expansion (CTE) of the silicon support falls in the range of about 2-3 ppm/° C., and the CTE of the reinforcing element is ±90% of the CTE of the silicon support, and
wherein said curable molding formulation is characterized as:
being moldable within 30 minutes at a temperature in the range of 100° C. to 200° C.,
being curable within 8 hours at a temperature in the range of 100° C. to 175° C.

16. The method of claim 15 wherein wafer warpage upon cure is reduced by at least 20% relative to an article prepared from a structure having no reinforcing element thereon.

17. The method of claim 15 wherein an 8" wafer of said structure undergoes <1 mm warpage upon cure and/or a 12" wafer of said structure undergoes <2 mm warpage upon cure.

18. A method to prepare wafers having reduced warpage upon cure thereof, said method comprising:
applying a curable molding formulation to one side of a silicon layer, then applying a reinforcing element to said curable molding formulation so as to minimize warping of said wafer upon cure of said curable molding formulation, and
curing said curable molding formulation after application of said reinforcing element to said curable molding formulation,
wherein the coefficient of thermal expansion (CTE) of the silicon layer falls in the range of about 2-3 ppm/° C., and the CTE of the reinforcing element is ±90% of the CTE of the silicon layer, and
wherein said curable molding formulation is characterized as:
being moldable within 30 min minutes at a temperature in the range of 100° C. to 200° C.,
being curable within 8 hours at a temperature in the range of 100° C. to 175° C.

19. The method of claim 18 wherein an 8" wafer of said structure undergoes <1 mm warpage upon cure and/or a 12" wafer of said structure undergoes <2 mm warpage upon cure.

20. The method of claim 18 wherein wafer warpage upon cure is reduced by at least 20% relative to an article prepared from a structure having no reinforcing element thereon.

21. A multilayer structure comprising:
a silicon layer containing a plurality of chips on one face thereof and an underfill layer underneath said chips,
a curable molding formulation applied to the same face as said plurality of chips, and
a reinforcing element applied to said molding formulation so as to minimize warping of said multilayer structure upon cure of said molding formulation,
wherein the coefficient of thermal expansion (CTE) of the silicon layer falls in the range of about 2-3 ppm/° C., and the CTE of the reinforcing element is ±90% of the CTE of the silicon layer,
wherein said curable molding formulation comprises a curable resin matrix containing 80-95 weight % filler, and
wherein said curable molding formulation is characterized as:
being moldable within 30 minutes at a temperature in the range of 100° C. to 200° C.,
being curable within 8 hours at a temperature in the range of 100° C. to 175° C.,
having a CTE alpha 1<30 ppm/° C.,
having weight loss <1.0% at 250° C., and
having a Tg>50° C.

22. The structure of claim 21 wherein said curable molding formulation is a liquid compression molding formulation, a powder compression molding formulation, a compression molding film, or a panel molding formulation.

23. The structure of claim 21 wherein the article produced by curing undergoes at least 20% less warpage than an article prepared from a structure having no reinforcing element thereon.

24. The structure of claim 21 wherein an 8" wafer of said structure undergoes <1 mm warpage upon cure and/or a 12" wafer of said structure undergoes <2 mm warpage upon cure.

* * * * *

UNITED STATES PATENT AND TRADEMARK OFFICE
CERTIFICATE OF CORRECTION

PATENT NO. : 9,865,551 B2  
APPLICATION NO. : 14/953787  
DATED : January 9, 2018  
INVENTOR(S) : Tadashi Takano et al.

It is certified that error appears in the above-identified patent and that said Letters Patent is hereby corrected as shown below:

In the Specification

Column 8, Line 18: change "1,3,6-ticyanatonaphthalene" to -- 1,3,6-tricyanatonaphthalene --.

Column 16, Line 46: change "grades E-21" to -- grades – i.e., E-21 --.

In the Claims

Column 23, Line 66: change "+90%" to -- ±90% --.

Signed and Sealed this  
Eighteenth Day of June, 2019

Andrei Iancu  
*Director of the United States Patent and Trademark Office*